United States Patent [19]

Golke et al.

[11] Patent Number: 5,309,389

[45] Date of Patent: May 3, 1994

[54] READ-ONLY MEMORY WITH COMPLEMENTARY DATA LINES

[75] Inventors: Keith W. Golke, Minneapolis; Mai T. MacLennan, Plymouth, both of Minn.

[73] Assignee: Honeywell Inc., Minneapolis, Minn.

[21] Appl. No.: 112,485

[22] Filed: Aug. 27, 1993

[51] Int. Cl.$^5$ .............................................. G11C 17/12
[52] U.S. Cl. ..................... 365/104; 365/154; 365/189.05; 365/189.06; 365/190; 365/203; 365/205; 365/208
[58] Field of Search ................... 365/104, 203, 189.05, 365/190, 208, 156, 189.06, 205, 154

[56] References Cited

U.S. PATENT DOCUMENTS

| | | | |
|---|---|---|---|
| 4,198,693 | 4/1980 | Kuo | 365/104 |
| 4,384,345 | 5/1983 | Mikome | 365/104 |
| 4,507,757 | 3/1985 | McElroy | 365/104 |
| 4,599,704 | 7/1986 | Mazin | 365/104 |
| 4,744,054 | 5/1988 | Kawata et al. | 365/104 |
| 4,773,047 | 9/1988 | Uchino et al. | 365/104 |
| 4,809,224 | 2/1989 | Suzuki et al. | 365/205 |
| 4,817,052 | 3/1989 | Shinoda et al. | 365/104 |
| 4,831,593 | 5/1989 | Kubota et al. | 365/203 |
| 5,018,103 | 5/1991 | Pomper et al. | 365/104 |

*Primary Examiner*—Joseph E. Clawson, Jr.
*Attorney, Agent, or Firm*—Gregory A. Bruns

[57] ABSTRACT

A plurality of single transistor memory cells arrayed in columns with the memory cells within a column connected to one or the other of precharged first and second output lines. An input line connected to the gate of the single transistor causes the first output line to be pulled to a first voltage when the cell is programmed a "true" and to be pulled to a second voltage when the cell is programmed a "complement". A pair of cross-coupled transistors connected between the first and second output lines of a column cause the second output line to be maintained at the precharged voltage when programmed a "true" and causes the first output line to be maintained at a precharged voltage when programmed a "complement".

10 Claims, 2 Drawing Sheets

READ-ONLY MEMORY WITH COMPLEMENTARY DATA LINES

BACKGROUND OF THE INVENTION

The present invention relates to fixed information content memories often referred to as readonly memories (ROM) and, more particularly, to such memories which are subject to charge generating disturbances.

Radiation can be loosely categorized into longterm global radiation, short-term global radiation, and short-term local radiation. Short-term global radiation is typically ionizing photon or electron radiation and is called "dose rate". The effect of the dose rate is to generate large photocurrents in silicon circuits. The photo currents are collected by circuit nodes and may cause an undesirable change in logic state by charging or discharging of the node.

Various circuit approaches are utilized to reduce the effects of radiation of the various categories. Among these approaches is the construction of memory circuits to minimize the effects of the large photocurrents due to dose rate radiation. For example, limiting the volume of circuit material exposed to dose rate can limit the photocurrent collection. Bipolar ROM operates at high speed and can be made quite small thereby limiting the volume of material exposed to dose rate. For example, a prior art bipolar ROM can be constructed as a vertical PNP device with the bit line connected to the P+ emitter and the word line connected to the N+ base. However, the bit line of the ROM just described will be at approximately 0.6–0.7 volts after being discharged and this will create a high power to ground current in data sensing circuitry.

The use of silicon on insulator (SOI) technology permits the design of circuits which have the charge collection volume reduced vertically by the buried oxide layer. SOI technology provides a dramatic increase in dose rate upset hardness when compared to bulk technology. Circuits such as the previously described vertical PNP ROM cannot be processed in SOI technology.

The one transistor N-channel or P-channel ROM cell available in the commercial market typically has the gate connected to the word line and the drain connected to the bit line when programmed in one state and not connected to the bit line when programmed in the opposite state. When subjected to dose rate, all the memory cells connected to the bit line will collect photocurrent and the bit line voltage will change contrary to what is desired from the ROM cell programmed by not being connected to the bit line. A load cell can be added to the bit line to compensate the bit line photocurrent to maintain a high or low state as required, but this solution will create high power to ground current when the selected ROM cell state cell connected to the bit line is the opposite of the load cell state DC since the ROM cell must overdrive the load cell state. Even when a ROM using MOSFETS is implemented in SOI technology, and other dose rate resistant circuit layout and packaging techniques are used, there continues to be a significant risk due to photo currents generated by dose rate radiation causing an unwanted change in the bit line voltage. This unwanted change in bit line voltage is referred to as bit line sag. Bit line sag can result in a data output error condition in a ROM.

Thus a need exists for a ROM cell that will reliably provide a full rail output voltage during dose rate and does not cause excessive power to ground current loading.

SUMMARY OF THE INVENTION

The present invention solves these and other needs by providing a nonvolatile memory device including a pair of output lines coupled to memory cells within a column with each memory cell including a transistor connected to one or the other of the output lines depending on whether the memory cell is programmed a "true" or a "complement". The output lines are precharged high or low depending on the memory cell transistor conductivity. An input line connected to the gate of the transistor acting in combination with the method of connection of the transistor causes one output line to be pulled to a first voltage when the cell is programmed a "true" and the other output line to be pulled to a first voltage when the cell is programmed a "complement". A pair of transistors of a conductivity type opposite the memory cell transistor causes an output line to be maintained at a high or low state depending on the memory cell transistor conductivity type.

DETAILED DESCRIPTION

Figure 1:
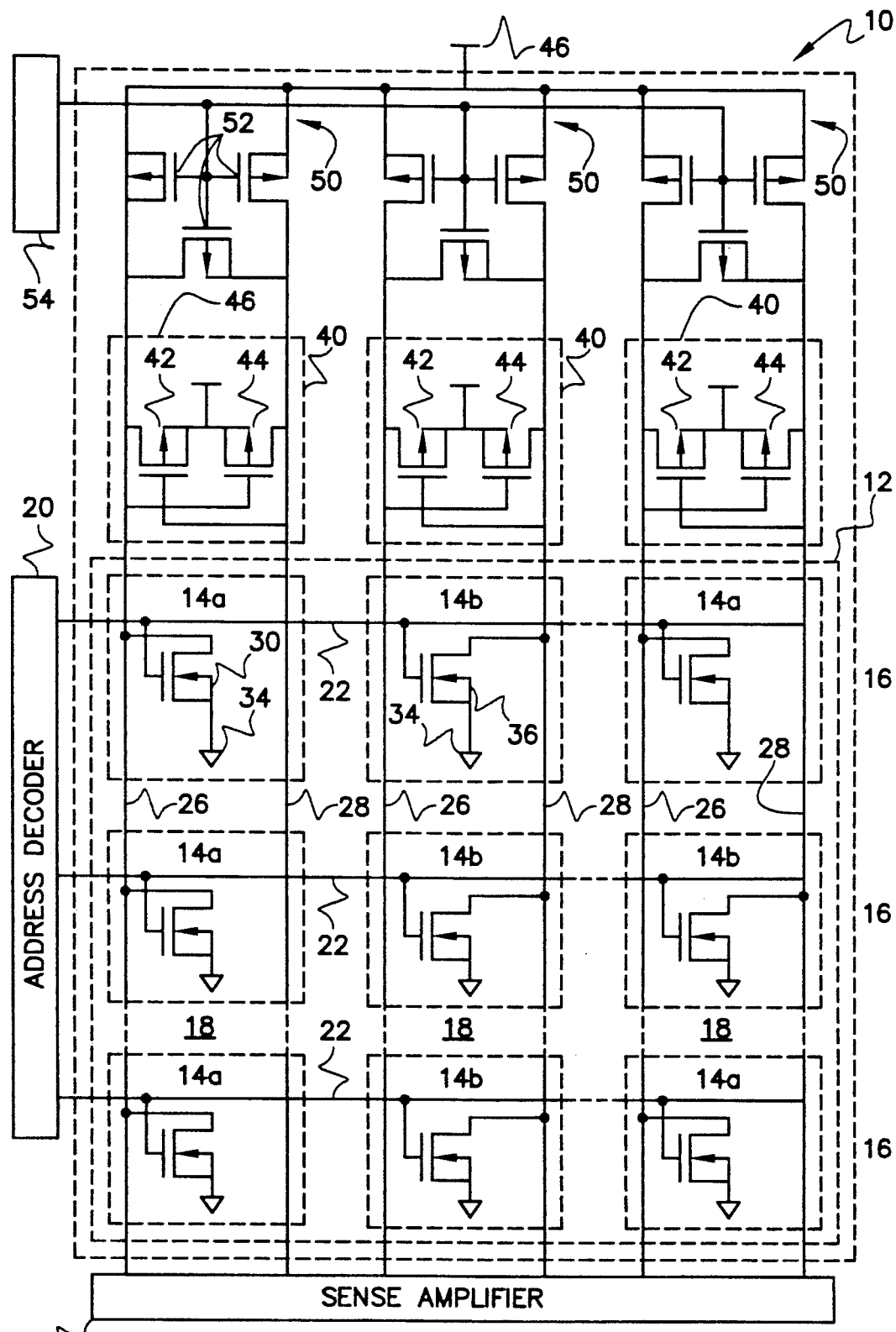
FIG. 1 is a schematic of a read-only memory according to the present invention.

An integrated circuit read-only memory (ROM) 10 is shown in the figures. ROM 10 includes an array 12 of memory elements or cells 14a, 14b arranged in a matrix of rows 16 and columns 18. Memory cells 14a have been programmed to store a "true" and memory cells 14b have been programmed to store a "complement". Address decoder 20 is a circuit selection means which enables or addresses a selected one of conductors or word lines 22 selectively in accordance with a signal from the digital system. Each one of the rows of memory cells 14a, 14b is connected to a corresponding one of word lines 22 as shown. Each memory cell 14a or 14b is connected between a pair of output lines which include a bit line 26 and a not bit line 28 which are connected to a sense amplifier within sense amplifier section 25.

During fabrication of ROM 10 as an integrated circuit, those memory elements 14a which are programmed to store a "true" have formed n-channel enhancement mode metal oxide semiconductor (MOS) field effect transistors 30. Transistor 30 is configured with its source connected to ground reference voltage 34 and its gate connected to word line 22. Transistor 30 has its drain connected to bit line 26. Those memory elements 14b which are programmed to store a "complement" have formed MOSFET transistors 36. Transistor 36 is configured with its source connected to ground voltage reference 34 and its gate connected to word line 22. Transistor 36 has its drain connected to not bit line 28.

Each column 18 of ROM 10, according to the teachings of the present invention also includes a circuit 40 including transistors 42 and 44. Transistor 42 has its drain connected to output line 26, its source connected to a positive voltage source 46, for example $V_{DD}$ and its gate connected to not bit line 28. Transistor 44 has its drain connected to not bit line 28, its source connected to $V_{DD}$ and its gate connected to bit line 26. This arrangement is referred to hereinafter as cross-coupled P-channel transistors. In an alternative embodiment described hereinafter cross-coupled N-channel transistors are used.

ROM 10 also includes a precharge circuit 50 for each column 18 of memory cells 14a and or 14b as shown in FIG. 1. Precharge circuit 50 includes p-channel MOSFETS 52 connected to precharge the output lines which include bit line 26 and not bit line 28 to a voltage of approximately positive voltage source 46. Precharge circuits 50 are controlled by precharge control means 54.

Now that the basic construction of ROM 10 has been set forth, the operation of ROM 10 may be described and appreciated. In operation, Precharge control means 54 activates precharge circuits 52 to precharge output lines 26 and 28 to the voltage of 46. Next a specific row of ROM 10 is selected according to decoder 20 which activates a word line 22. Memory cells 14a will have transistor 30 conduct to pull voltage of bit line 26 to ground reference voltage 34. If the voltage of not bit line 28 should decrease or sag then transistor 44, which has its gate connected to bit line 26 which is low with respect to the source of transistor 44, conducts to maintain not bit line 28 at the full voltage of positive voltage source 46, for example $V_{DD}$. Memory cells 14b will have transistor 36 conduct to pull voltage of not bit line 28 to the voltage of ground voltage reference 34. Bit line 2 will remain at the voltage of positive voltage source 46. In addition if the voltage of bit line 26 should decrease then transistor 42, which has its gate connected to not bit line 28 which is low with respect to the source of transistor 42, conducts to hold bit line 26 at positive voltage source 46.

Figure 2:
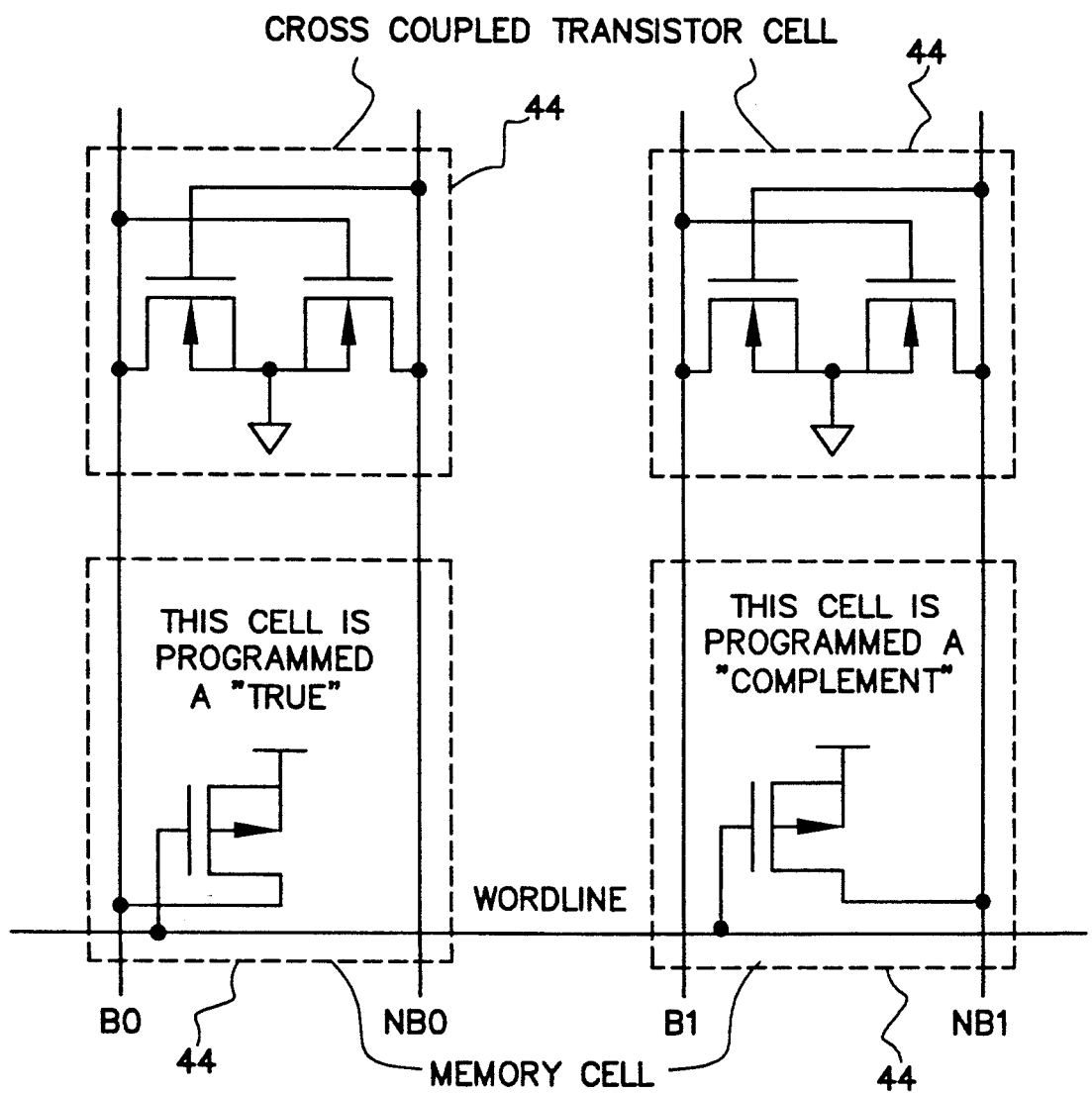
FIG. 2 is a partial schematic of illustrative memory cells of the present invention implemented with P-channel transistors.

The embodiment of Applicant's invention shown in FIG. 1 uses n-channel MOSFETS for the transistors of memory cells 14a and 14b. The invention can of course be implemented using p-channel MOSFETS for the transistors of memory cells 14a and 14b, and this is illustrated in FIG. 2 where a representative memory cell 14c programmed as a true, a representative memory cell 14d programmed as a complement, and cross-coupled transistor circuit 41 are illustrated. In FIG. 2 all bit lines or output lines, i.e., B0, NB0, B1, and NB1 are precharged low and the word line charges either the bit line or not bit line depending on whether the ROM cell is programmed a "true" or a "complement". Cross coupled N-channel transistors 41 on the bit lines are required to maintain a low state on the bit line.

In accordance with the foregoing description, Applicant has developed a ROM that can be implemented in bulk silicon or SOI technologies. Although specific embodiments of Applicant's invention have been shown and described for illustrative purposes, a number of variations and modifications will be apparent to those of ordinary skill in the relevant arts. It is not intended that coverage be limited to the disclosed embodiments, but only by the terms of the following claims.

We claim:

1. A nonvolatile memory device comprising:
a plurality of memory cells arrayed in columns, each said memory cell comprising a first transistor having a first terminal, a second terminal and a gate terminal;
said first terminal connected to a first voltage;
an input terminal connected to said gate terminal;
first and second output lines for each said column, with said second terminal connected to said first output line when said memory cell is programmed a true and said second terminal connected to said second output line when said memory cell is programmed a complement;
means for precharging said first and second output lines to a second voltage; and
means for maintaining said second output line at said second voltage when said cell is programmed a true and means for maintaining said first output line at a second voltage when said cell is programmed a complement.

2. Memory device of claim 1 wherein said means for maintaining said second output line at said second voltage when said cell is programmed a true, and for maintaining said first output line at said second voltage when said cell is programmed a complement comprises a second transistor and a third transistor said second and third transistors being of an opposite conductivity type from said first transistor, said second and third transistors cross coupled between said first output line and said second output line of each said column.

3. Memory device of claim 2 wherein said first transistor is an N-channel MOSFET, said first voltage is a ground reference voltage and said second voltage is a positive voltage.

4. Memory device of claim 2 wherein said first transistor is a P-channel MOSFET, said first voltage is a positive voltage and said second voltage is a ground reference voltage.

5. A semiconductor read only memory device comprising:
a plurality of word lines;
a plurality of output lines intersecting said word lines;
a plurality of memory cells arranged in a matrix arrangement of rows and columns with the memory cells within a column coupled to either a first output line or a second output line, each memory cell including a first transistor having a first terminal, a second terminal, and a gate terminal;
one of said word lines connected to said first transistor gate;
said first terminal connected to a first voltage;
said second terminal connected to said first output line when said cell is programmed a true and said first terminal connected to said second output line when said cell is programmed a complement;
precharge means for charging said first and second output lines to a second voltage;
means for maintaining said second output line at said second voltage when said cell is programmed a true, and for maintaining said first output line at said second voltage when said memory cell is programmed a complement.

6. Memory device of claim 5 wherein said means for maintaining said second output line at said second voltage when said cell is programmed a true, and for maintaining said first output line at said second voltage when said cell is programmed a complement comprises a second transistor and a third transistor said second and third transistors being of an opposite conductivity type from said first transistor, said second and third transistors cross coupled between said first output line and said second output line of each said column.

7. Memory device of claim 6 wherein said first voltage is a ground reference voltage and said second voltage is a positive voltage.

8. Memory device of claim 7 wherein said first transistor is an N-channel MOSFET and said second and third transistors are P-channel MOSFETS.

9. Memory device of claim 6 wherein said first voltage is a positive voltage and said second voltage is a ground reference voltage.

10. Memory device of claim 9 wherein said first transistor is a P-channel MOSFET and said second and third transistors are N-channel MOSFETS.

* * * * *